(12) United States Patent
Kurjanowicz

(10) Patent No.: US 8,059,479 B2
(45) Date of Patent: Nov. 15, 2011

(54) TEST CIRCUIT FOR AN UNPROGRAMMED OTP MEMORY ARRAY

(75) Inventor: Wlodek Kurjanowicz, Ottawa (CA)

(73) Assignee: Sidense Corp., Ottawa (CA)

( * ) Notice: Subject to any disclaimer, the term of this patent is extended or adjusted under 35 U.S.C. 154(b) by 392 days.

(21) Appl. No.: 12/342,367

(22) Filed: Dec. 23, 2008

(65) Prior Publication Data

US 2009/0251943 A1 Oct. 8, 2009

Related U.S. Application Data

(60) Provisional application No. 61/042,052, filed on Apr. 3, 2008.

(51) Int. Cl.
*G11C 29/00* (2006.01)
(52) U.S. Cl. .......................................... 365/201; 365/96
(58) Field of Classification Search .................. 365/201, 365/96, 230.06
See application file for complete search history.

(56) References Cited

U.S. PATENT DOCUMENTS

| | | | |
|---|---|---|---|
| 5,007,026 A | 4/1991 | Gaultier et al. | |
| 6,515,923 B1 * | 2/2003 | Cleeves | 365/201 |
| 7,136,322 B2 | 11/2006 | Brennan et al. | |
| 7,298,665 B2 * | 11/2007 | So et al. | 365/230.06 |
| 7,402,855 B2 | 7/2008 | Kurjanowicz | |
| 2007/0257331 A1 | 11/2007 | Kurjanowicz et al. | |

OTHER PUBLICATIONS

Canadian Patent Application No. 2,646,220: Office Action dated Mar. 27, 2009.
International Patent Application No. PCT/CA2009/000368, International Search Report dated Jul. 10, 2009.

* cited by examiner

*Primary Examiner* — Vu Le
(74) *Attorney, Agent, or Firm* — Shin Hung; Borden Ladner Gervais LLP

(57) ABSTRACT

Circuits for testing unprogrammed OTP memories to ensure that wordline and bitline connections, column decoders, wordline drivers, correctness of decoding, sensing and multiplexing operate properly. The OTP testing system includes one or both of column test circuitry and row test circuitry. The column test circuitry charges all the bitlines to a voltage level similar to that provided by a programmed OTP memory cell during a read operation, in response to activation of a test wordline. The bitline voltages can be sensed, thereby allowing for testing of the column decoding and sense amplifier circuits. The row test circuitry charges a test bitline to a voltage level similar to that provided by a programmed OTP memory cell during a read operation, in response to activation of a wordline of the OTP memory array. This test bitline voltage can be sensed, thereby allowing for testing of the row decoding and driver circuits.

20 Claims, 10 Drawing Sheets

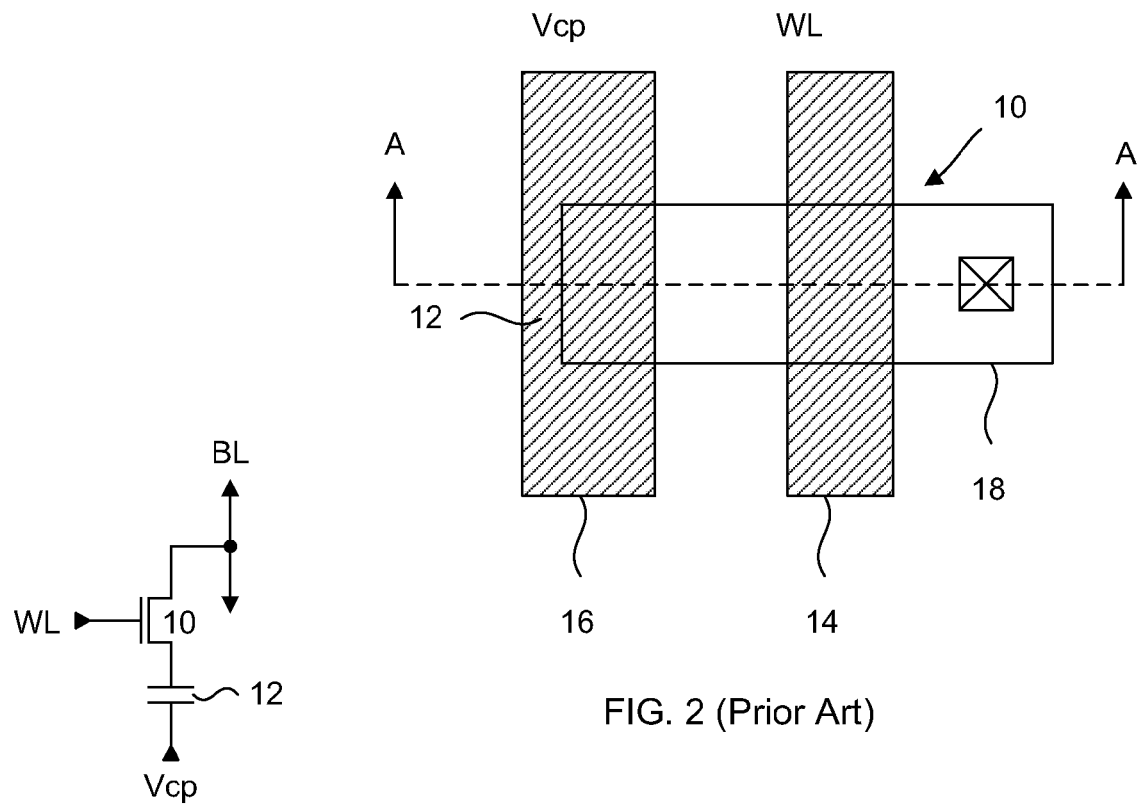
FIG. 2 (Prior Art)
FIG. 1 (Prior Art)
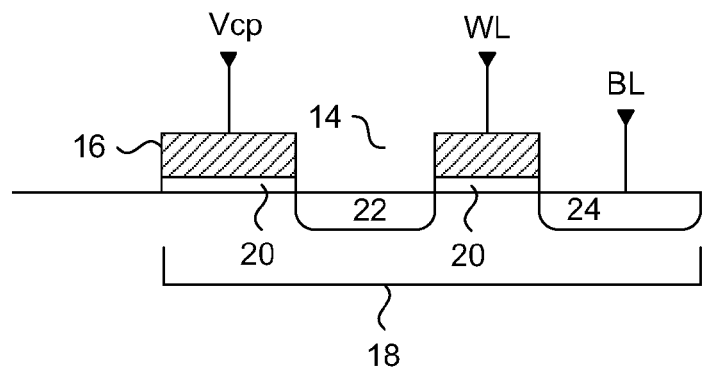
FIG. 3 (Prior Art)

TEST CIRCUIT FOR AN UNPROGRAMMED OTP MEMORY ARRAY

CROSS REFERENCE TO RELATED APPLICATIONS

This application claims the benefit of priority of U.S. Provisional Patent Application No. 61/042,052, filed on Apr. 3, 2008, which is incorporated herein by reference in its entirety.

FIELD OF THE INVENTION

The present invention relates generally to non-volatile memory. More specifically, the invention is directed to one-time programmable (OTP) memories.

BACKGROUND OF THE INVENTION

Anti-fuse memory is one type of one-time programmable (OTP) memory in which the device can be permanently programmed (electrically) with data once. This data is programmed by an end user for a particular application. There are several types of OTP memory cells which can be used. OTP memories provide users with a level of flexibility since any data can be programmed.

Anti-fuse memory can be utilized in all one time programmable applications, including RF-ID tags. RF-ID tagging applications are gaining more acceptance in the industry, particularly in sales, security, transport, logistics, and military applications for example. The simplicity and full CMOS compatibility anti-fuse memory allows for application of the RF-ID tag concept to integrated circuit manufacturing and testing processes. Therefore, IC manufacturing productivity can be increased by utilizing anti-fuse memory in combination with an RF communication interface on every wafer and/or every die on the wafer allowing for contact-less programming and reading chip specific or wafer specific information during IC manufacturing and packaging, as well as during printed circuit board assembly.

FIG. 1 is a circuit diagram of a known anti-fuse memory cell, while FIGS. 2 and 3 show the planar and cross-sectional views respectively of the anti-fuse memory cell shown in FIG. 1. The anti-fuse memory cell of FIG. 1 includes a pass, or access transistor 10 for coupling a bitline BL to a bottom plate of anti-fuse device 12. Anti-fuse device 12 is considered a gate dielectric breakdown based anti-fuse devices. A wordline WL is coupled to the gate of access transistor 10 to turn it on, and a cell plate voltage Vcp is coupled to the top plate of anti-fuse device 12 for programming anti-fuse device 12.

It can be seen from FIGS. 2 and 3 that the layout of access transistor 10 and anti-fuse device 12 is very straight-forward and simple. The gate 14 of access transistor 10 and the top plate 16 of anti-fuse device 12 are constructed with the same layer of polysilicon, which extend across active area 18. In the active area 18 underneath each polysilicon layer, is formed a thin gate oxide 20, also known as a gate dielectric, for electrically isolating the polysilicon from the active area underneath. On either side of gate 14 are diffusion regions 22 and 24, where diffusion region 24 is coupled to a bitline. Although not shown, those of skill in the art will understand that standard CMOS processing, such as sidewall spacer formation, lightly doped diffusions (LDD) and diffusion and gate silicidation, can be applied. While the classical single transistor and capacitor cell configuration is widely used, a transistor-only anti-fuse cell is further desirable due to the semiconductor array area savings that can be obtained for high-density applications. Such transistor-only anti-fuses should be reliable while simple to manufacture with a low cost CMOS process.

FIG. 4a shows a cross-sectional view of an anti-fuse transistor that can be manufactured with any standard CMOS process. This anti-fuse transistor and its variants are disclosed in commonly owned U.S. patent application Ser. No. 10/553,873 filed on Oct. 21, 2005, and commonly owned U.S. patent application Ser. No. 11/762,552 filed on Jun. 13, 2007, the contents of which are incorporated by reference. In the presently shown example, the anti-fuse transistor is almost identical to a simple thick gate oxide, or input/output MOS transistor with one floating diffusion terminal. The disclosed anti-fuse transistor, also termed a split-channel capacitor or a half-transistor, can be reliably programmed such that the fuse link between the polysilicon gate and the substrate can be predictably localized to a particular region of the device. The cross-section view of FIG. 4a is taken along the channel length of the device. The channel is generally understood to be the area underneath an overlying polysilicon gate, having a length defined by edges of the polysilicon gate adjacent respective diffusion regions.

Anti-fuse cell 30 includes a variable thickness gate oxide 32 formed on the substrate channel region 34, a polysilicon gate 36, sidewall spacers 38, a field oxide region 40 a diffusion region 42, and an LDD region 44 in the diffusion region 42. A bitline contact 46 is shown to be in electrical contact with diffusion region 42. The variable thickness gate oxide consists of a thick gate oxide 32 and a thin gate oxide 33 such that a portion of the channel length is covered by the thick gate oxide and the remaining portion of the channel length is covered by the thin gate oxide. Generally, the thin gate oxide is a region where oxide breakdown can occur. The thick gate oxide edge meeting diffusion region 42 on the other hand, defines an access edge where gate oxide breakdown is prevented and current between the gate 36 and diffusion region 42 is to flow for a programmed anti-fuse transistor. While the distance that the thick oxide portion extends into the channel region depends on the mask grade, the thick oxide portion is preferably formed to be at least as long as the minimum length of a high voltage transistor formed on the same chip.

In this example, the diffusion region 42 is connected to a bitline through a bitline contact 46, or other line for sensing a current from the polysilicon gate 36, and can be doped to accommodate programming voltages or currents. This diffusion region 42 is formed proximate to the thick oxide portion of the variable thickness gate oxide. To further protect the edge of anti-fuse cell 30 from high voltage damage, or current leakage, a resistor protection oxide (RPO), also known as a salicide protect oxide, can be introduced during the fabrication process to further space metal particles from the edge of sidewall spacer 38. This RPO is preferably used during the salicidiation process for preventing only a portion of diffusion region 42 and a portion of polysilicon gate 36 from being salicided. It is well known that salicided transistors are known to have higher leakage and therefore lower breakdown voltage. Thus having a non-salicided diffusion region 42 will reduce leakage. Diffusion region 42 can be doped for low voltage transistors or high voltage transistors or a combination of the two resulting in same or different diffusion profiles.

A simplified plan view of the anti-fuse cell 30 is shown in FIG. 4b. Bitline contact 46 can be used as a visual reference point to orient the plan view with the corresponding cross-sectional view of FIG. 4a. The active area 48 is the region of the device where the channel region 34 and diffusion region 42 is formed, which is defined by an OD mask during the fabrication process. The dashed outline 50 defines the areas in which the thick gate oxide is to be formed via an OD2 mask during the fabrication process. More specifically, the area enclosed by the dashed outline 50 designates the regions where thick oxide is to be formed. OD simply refers to an oxide definition mask that is used during the CMOS process for defining the regions on the substrate where the oxide is to be formed, and OD2 refers to a second oxide definition mask different than the first. According to an embodiment of the present invention, the thin gate oxide area bounded by edges of the active area 48 and the rightmost edge of the OD2 mask, is minimized. In the presently shown embodiment, this area can be minimized by shifting the rightmost OD2 mask edge towards the parallel edge of active area 48. Commonly owned U.S. patent application Ser. No. 11/762,552 filed on Jun. 13, 2007, the contents of which are incorporated by reference, describes alternate single transistor anti-fuse memory cells which can be used in a non-volatile memory array.

FIG. 5 is a plan view layout of a single transistor anti-fuse memory cell memory array according to an embodiment of the present invention. In the present example, only four wordlines and four bitlines are shown. Each single transistor anti-fuse cell 30 in memory array 60 has one polysilicon gate 62, and have the same structure as anti-fuse cell 30 of FIGS. 4a and 4b. In memory array 60, the polysilicon line forming polysilicon gates 62 of each anti-fuse memory cell are common to all the anti-fuse memory cells of the row. Memory array 60 is shown to include sixteen anti-fuse memory cells, where four are arranged in each of first row 64, second row 66, third row 68 and fourth row 70. Wordlines WLi, WLi+1, WLi+2 and WLi+3 are connected to the polysilicon gates 62 of rows 64, 66, 68 and 70 respectively. The dashed outlines 72 define the areas in the memory array in which a thick gate oxide is to be formed via a thick gate oxide definition mask during the fabrication process. In the configuration shown in FIG. 5, each pair of memory cells from rows 64 and 66 share a common diffusion region 74 and a common bitline contact 76. Each bitline contact is connected to a different bitline, such as bitlines BLn, BLn+1, BLn+2 and BLn+3. Connected to each of the bitlines is a precharge circuit 78, and a column decoder and sense amplifier circuit block 80. The precharge circuit 78 is responsible for precharging all the bitlines to a predetermined voltage for a read operation, while the column decoder and sense amplifier circuit block 80 includes multiplexing devices for sharing one sense amplifier with one or more bitlines. The actual layout of a memory array using the architecture of FIG. 5 can have the precharge circuit 78 located at one end of the bitlines opposite to the column decoder and sense amplifier circuit block 80, or adjacent or integrated with the column decoder and sense amplifier circuit block 80.

An overview of the program and read operations is now discussed with reference to the anti-fuse cell 30 of FIGS. 4a and 4b, and memory array 60 of FIG. 5. Generally, the anti-fuse transistors are programmed by rupturing the gate oxide, preferably at one of the thin/thick gate oxide boundary and the thin gate oxide/source diffusion edge. This is accomplished by applying a high enough voltage differential between the gate and the channel of the cells to be programmed and a substantially lower voltage differential, if any, on all other cells. Therefore, once a permanent conductive link is formed, a current applied to the polysilicon gate will flow through the link and the channel to the diffusion region, which can be sensed by conventional sense amplifier circuits. In the present example, programming of anti-fuse cell 30 is achieved by grounding selected bitlines to 0V, and driving a selected row to a programming voltage level (VPP) that is typically greater than the VDD voltage supply provided to other circuits. Under these conditions, the thin gate oxide 33 is intended to breakdown in the presence of the large electrical field formed between the channel region 34 and the wordline, thereby creating an electrically conductive connection between channel region 34 and polysilicon gate 36. This electrically conductive connection can be referred to as a conductive link or anti-fuse. In FIG. 5 for example, if BLn is grounded and WLi is selected to be driven to VPP, then the anti-fuse cell 30 at the intersection of BLn and WLi will be programmed once its conductive link is formed. Hence any anti-fuse transistor connected to WLi can be programmed if its corresponding bitline is grounded. On the other hand, inhibiting programming of any anti-fuse transistor connected to WLi is done by biasing the bitlines connected to them to VDD. The reduced electric field is insufficient for the conductive link to be formed.

To read a programmed or unprogrammed anti-fuse transistor with a formed conductive link, all the bitlines are precharged to VSS followed by driving a selected wordline to VDD. Any programmed anti-fuse transistor having a conductive link will drive its corresponding bitline to VDD through its VDD driven wordline via the conductive link. The increased bitline voltage can then be sensed. Any unprogrammed anti-fuse transistor having an absence of a conductive link will have no effect on its corresponding bitline, which means that it remains at the VSS precharge level.

It should be appreciated by those skilled in the art that OTP memories are programmed by the end customer, not by the manufacturer or the vendor. Accordingly, there should be some qualification provided by the manufacturer that the provided OTP memories have been tested to operate properly before use by the end customer. More specifically, the manufacturer should qualify that the circuits of the OTP memory function properly. Defective cells can be replaced with extra rows or columns of cells after unsuccessful programming by the end user, using well known redundancy techniques. In particular, this testing should ensure that fabricated circuits such as the row decoders and column decoders function as designed, and that there are no manufacturing defects during formation of wordlines and bitlines.

It is difficult to test the functionality of the previously described OTP memory device because the bitlines are precharged to a voltage level that corresponds to that of an unprogrammed cell, and driving wordlines to a read voltage will have no effect as the cells are unprogrammed. For the described OTP memory device, the bitlines will rise towards VDD only when a programmed OTP memory cell is activated.

It is, therefore, desirable to provide circuits for testing an unprogrammed OTP memory array, without programming any of the OTP memory cells.

SUMMARY OF THE INVENTION

It is an object of the present invention to obviate or mitigate at least one disadvantage of previous OTP testing methods and systems.

In a first aspect, the present invention provides a one time programmable (OTP) memory. The OTP memory includes a memory array, decoding circuits, a test circuit, and sense circuitry. The memory array includes unprogrammed OTP cells, while the decoding circuits are located at a first end of the memory array. The test circuit is located at a second and opposite end of the memory array for coupling at least one bitline towards a first voltage in response to an activated wordline during a testing operation. The at least one bitline is precharged to a second voltage during a normal read operation. The sense circuitry senses the voltage of the at least one bitline. According to one embodiment of the present aspect, the first voltage of the at least one bitline corresponds to a read voltage provided by a programmed OTP cell.

In another embodiment, the test circuit couples a plurality of bitlines connected to the unprogrammed OTP cells to the first voltage, and the decoding circuits include column circuits connected to the plurality of bitlines. In this embodiment, the test circuit includes a row of test cells having their gate terminals formed by the activated wordline, and each of the test cells is connected to one of the plurality of bitlines. Each of the test cells are mask programmed to couple the first voltage to a corresponding bitline in response to the activated wordline. Alternately, each of the test cells is identical in structure and layout to one of the unprogrammed OTP cells, and programmable for coupling the first voltage of the activated wordline to a corresponding bitline. The unprogrammed OTP cells and the test cells can be single transistor anti-fuse cells having identical layouts, or two-transistor anti-fuse cells having identical layouts.

In yet another embodiment of the present aspect, the decoding circuits include row circuits connected to a plurality of wordlines, the activated wordline being one of the plurality of wordlines, and the plurality of wordlines being connected to rows of the unprogrammed OTP cells. In the present embodiment, the test circuit includes a column of test cells having their gate terminals formed by the plurality of wordlines, where each of the test cells is connected to the at least one bitline. Each of the test cells can be mask programmed to couple the first voltage to the at least one bitline in response to the activated wordline. Alternately, each of the test cells is identical in structure and layout to one of the unprogrammed OTP cells, and programmable for coupling the first voltage of the activated wordline to a corresponding bitline. Furthermore, the sense circuitry is a dedicated test sense amplifier for sensing the first voltage of the at least one bitline, and the test circuit includes a test coupling device for selectively connecting the at least one bitline to a bitline connected to a column of unprogrammed OTP cells.

In second aspect, the present invention provides a one time programmable (OTP) memory. The OTP memory includes a memory array, a row test circuit, a column test circuit, and sense circuitry. The memory array has unprogrammed OTP cells connected to wordlines and bitlines. The row test circuit is connected to the wordlines for charging a test bitline to a first voltage in response to activation of one of the wordlines. The column test circuit couples the bitlines to the first voltage in response to activation of a test wordline during a testing operation, where the bitlines are precharged to a second voltage during a normal read operation. The sense circuitry senses the voltage of the bitlines and the test bitline. According to embodiments of the second aspect, the row test circuit is connected to a first end of the wordlines, and row circuits for driving the wordlines are connected to a second end of the wordlines opposite to the first end. The row test circuit includes a column of row test cells having their gate terminals formed by the wordlines, each of the row test cells being connected to the test bitline. The column test circuit is connected to a first end of the bitlines, and column circuits are connected to a second end of the bitlines opposite to the first end. The column test circuit includes a row of column test cells connected to the bitlines and have their gates formed by the test wordline. The row test cells and the column test cells include mask programmable cells having a first diffusion region connected to the first voltage and a second diffusion region connected to one of the bitlines and the test bitline.

In a third aspect, the present invention provides a method for testing an unprogrammed one time programmable (OTP) memory array. The method includes activating a test circuit and sensing the at least one bitline. The step of activating includes coupling at least one bitline to a first voltage level, the at least one bitline being precharged to a second voltage level during a normal read operation. The step of sensing includes providing a logic state corresponding to one of a presence and absence of the voltage level. According to an embodiment of the third aspect, activating includes driving a wordline coupled to a row of programmed test memory cells, the programmed test memory cells coupling a plurality of bitlines to the first voltage level. The method can include a further step of iteratively changing a column address and sensing a different bitline of the plurality of bitlines. The programmed test memory cells can include mask programmed memory cells. Prior to the step of activating, unprogrammed OTP memory cells are programmed to be the programmed test memory cells.

In another embodiment of the third aspect, the at least one bitline includes a test bitline connected to a column of programmed test memory cells, and activating includes driving a wordline coupled to one of the programmed test memory cells for coupling the test bitline to the first voltage level. This embodiment further includes precharging the test bitline to the second voltage level after the step of sensing, and changing a row address for driving another wordline coupled to another one of the programmed test memory cells. The programmed test memory cells can include mask programmed memory cells, or prior to activating, unprogrammed OTP memory cells are programmed to be the programmed test memory cells.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIG. 1 is a circuit diagram of a DRAM-type anti-fuse cell;

FIG. 2 is a planar layout of the DRAM-type anti-fuse cell of FIG. 1;

FIG. 3 is a cross-sectional view of the DRAM-type anti-fuse cell of FIG. 2 along line A-A;

FIG. 4b is a planar layout of the variable thickness gate oxide anti-fuse transistor of FIG. 4a;

FIG. 5 is a plan view of a single-transistor anti-fuse memory array using the variable thickness gate oxide memory cell of FIG. 4a;

DETAILED DESCRIPTION

Generally, the present invention provides a method and system for testing unprogrammed OTP memories to ensure that wordline and bitline connections, column decoders, wordline drivers, correctness of decoding, sensing and multiplexing operate properly. The OTP testing system includes one or both of column test circuitry and row test circuitry. The column test circuitry couples all the bitlines to a voltage level similar to that provided by a programmed OTP memory cell during a read operation, in response to activation of a test wordline. The bitline voltages can be sensed, thereby allowing for testing of the column decoding and sense amplifier circuits. The row test circuitry couples a test bitline to a voltage level similar to that provided by a programmed OTP memory cell during a read operation, in response to activation of a wordline of the OTP memory array. The voltage of the test bitline can be sensed, thereby allowing for testing of the row decoding and driver circuits. Hence the continuity of signal lines such as wordlines and bitlines can be tested, as can the logic relied upon for driving these signal lines.

Figure 6:
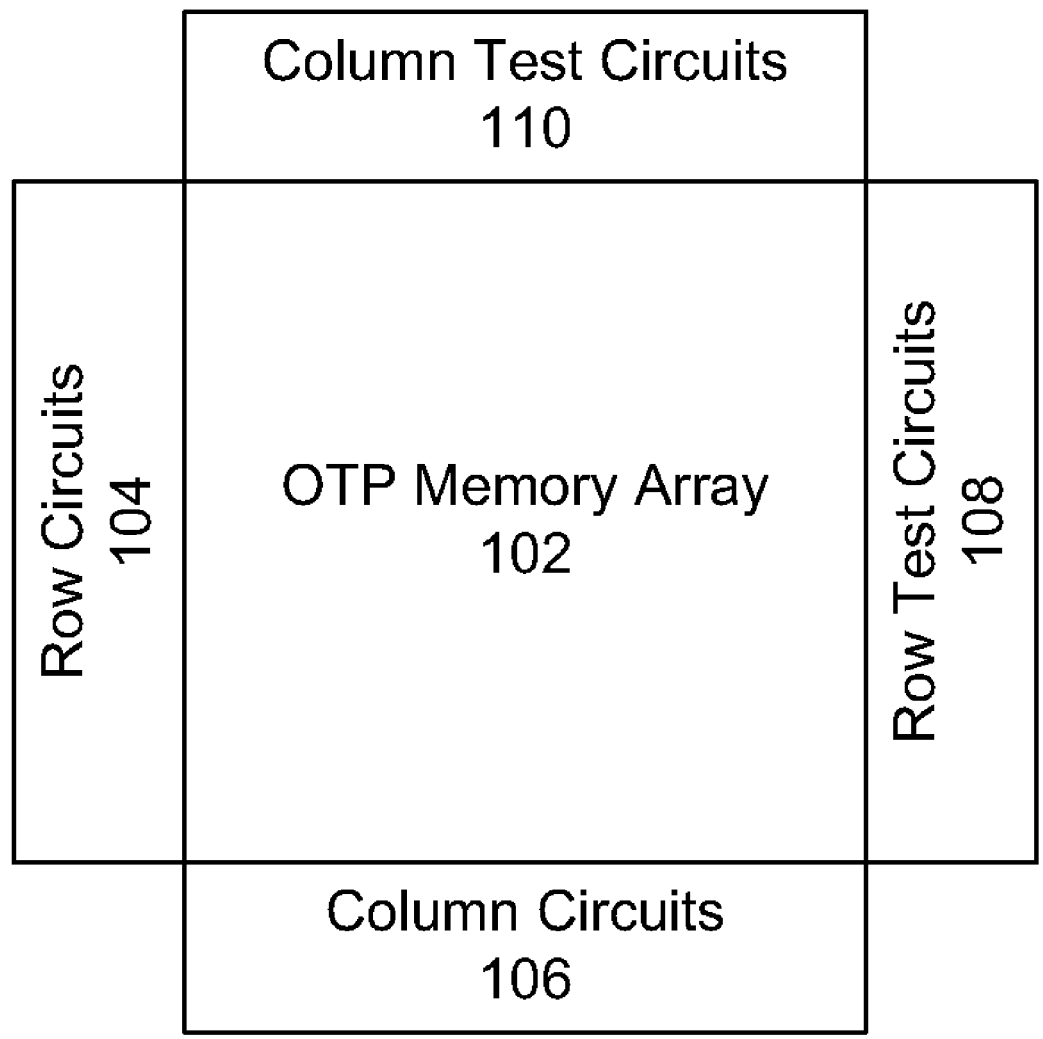
FIG. 6 is a block diagram of an OTP memory device according to an embodiment of the present invention.

FIG. 6 is a block diagram illustrating an embodiment of the present invention. OTP memory device 100 includes an OTP memory array 102 consisting of OTP memory cells connected to wordlines and bitlines, where the wordlines extend horizontally and the bitlines extend vertically within the OTP memory array 102. Connected to a first end of the wordlines is a row circuit block 104 that includes row related circuits such as row decoders and row drivers for example. Connected to a first end of the bitlines is a column circuit block 106 that includes column related circuits such as column decoders and sense amplifiers for example. Connected to a second and opposite end of the wordlines is a row test circuit block 108 that is used for testing the functionality of the row circuits and the physical condition of each wordline. Connected to a second and opposite end of the bitlines is a column test circuit block 110 that is used for testing the functionality of the column circuits and the physical condition of each bitline. It is noted that only the memory array and relevant memory array circuits are shown for OTP memory device 100, as persons skilled in the art will understand that there are other circuits and logic that are required to enable proper operation. The physical placement of the row test circuits 108 and the column test circuits 110 enables testing of the physical integrity, or continuity, of the wordlines and the bitlines. To minimize circuit area overhead, the row test circuits 108 and the column test circuits 110 are formed as memory cells having the same physical layout and substantially the same construction as the memory cells of OTP memory array 102. These test cells thus emulate the electrical behaviour of the OTP memory array memory cells. Further details of the row test circuits 108 and the column test circuits 110 according to one embodiment are shown in FIG. 7.

Figure 7:
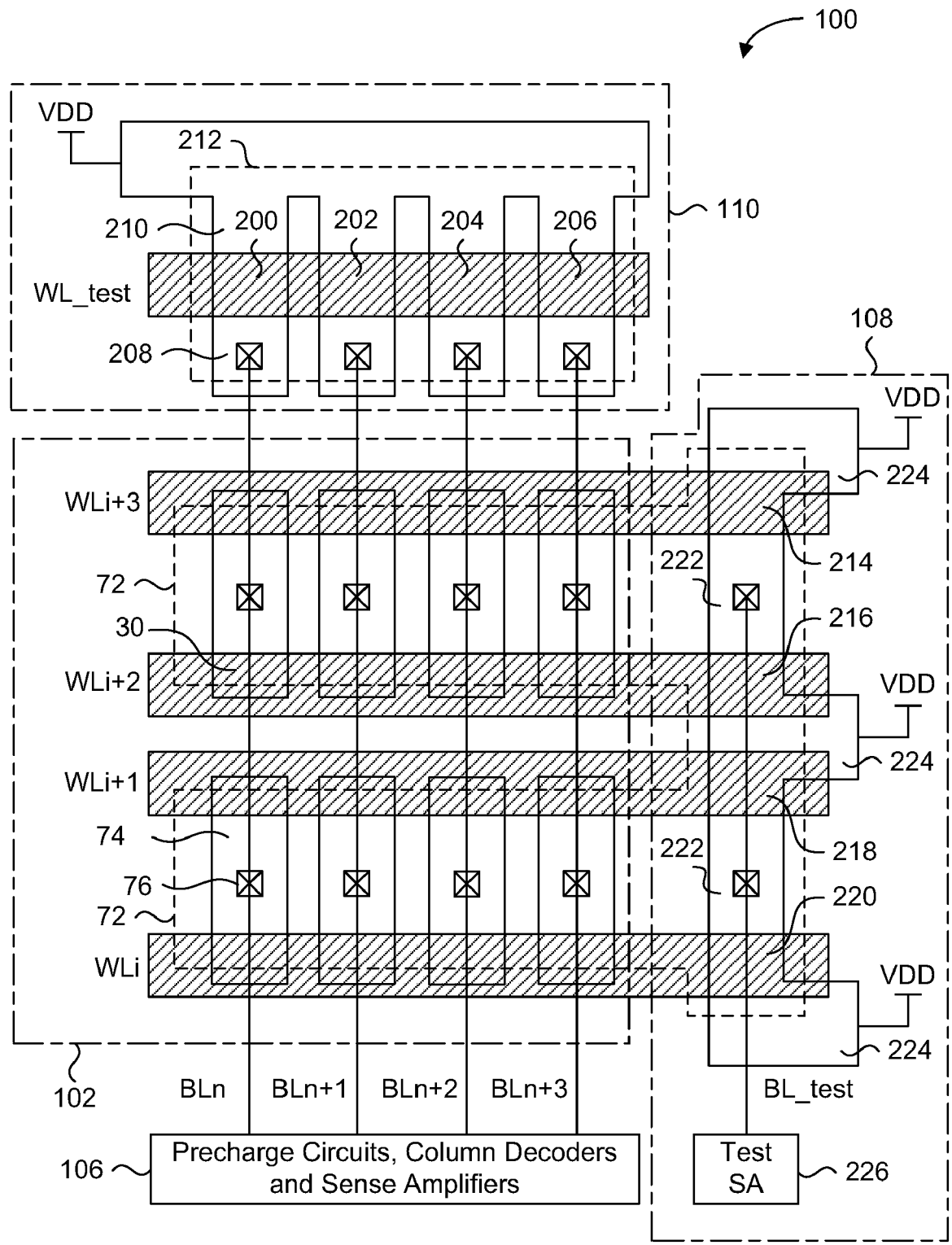
FIG. 7 is a plan view of a single-transistor anti-fuse memory array with row and column test circuits, according to an embodiment of the present invention.

FIG. 7 is a plan view transistor level layout showing an example embodiment of the OTP memory device 100 of FIG. 6. In particular, transistor level examples of the OTP memory array 102, the row test circuit 108 and the column test circuit 110 are illustrated, while the column circuit block 106 represents known column circuits, such as precharge circuits, column decoders and sense amplifiers. The row circuit block 104 is not shown in FIG. 7, however persons of skill in the art will understand that such circuits are well known in the art. All the transistors shown in FIG. 7 are n-channel transistors. The OTP memory array 102 is an array of anti-fuse cells 30, such as the single-transistor anti-fuse memory cells shown and described in FIGS. 4a, 4b and 5. In the present example, only four wordlines WLi to WLi+3 and four bitlines BLn to BLn+3 are shown for the OTP memory array 102. These wordlines and bitlines are now referred to as normal wordlines and normal bitlines. The features of the single-transistor anti-fuse memory cell have been previously described, and are therefore not described again for the present embodiment.

The column test circuit 110 is connected to a second end of the normal bitlines opposite to the first end, which are connected to the column circuit block 106. The purpose for this placement is to test the physical integrity of the entire bitline length. The column test circuit 110 includes a row of column test cells, such as mask programmed read only memory (MROM) cells, where there is a one-to-one ratio of MROM cells to normal bitlines. As shown in FIG. 7, MROM cells 200, 202, 204 and 206 have a polysilicon gate that corresponds to test wordline WL_test, where each of the MROM cells has a drain terminal 208 connected to a corresponding normal bitline via a bitline contact, and a source terminal 210 connected to voltage supply VDD. According to the present embodiment, each MROM cell is similar in construction to the anti-fuse transistor devices and are subjected to the same process steps, except that they do not have a variable thickness gate oxide. In the example of FIG. 7, a thick gate oxide definition mask 212 identical to the thick gate oxide definition mask 72 in the OTP memory array 102, is used to define a thick gate oxide over the channel regions underneath the polysilicon gate of WL_test. In other words, MROM cells 200, 202, 204 and 206 function similarly to either core logic transistors or I/O transistors formed on the same substrate as OTP memory device 100.

In operation, each of the MROM cells charges its corresponding normal bitline to about VDD-Vtn, where Vtn is a threshold voltage of an n-channel transistor, in response to WL_test being activated or driven to a positive voltage level such as VDD or VREF. If there is a defect in the column decoding logic, or a physical defect such as a break in the bitline anywhere between the column test circuit 110 and the column circuits 106, then that bitline will not have the VDD-Vtn voltage level. Accordingly, the failure to sense the VDD_Vtn voltage on a normal bitline indicates some type of failure related to that bitline or the column decoding for that bitline.

The row test circuit 108 is connected to a second end of the normal wordlines opposite to the first end, which are connected to row circuit block 104 (not shown). The purpose for this placement is to test the physical integrity of the entire wordline length. The row test circuit 108 includes a column of row test cells, such as MROM cells, where there is a one-to-one ratio of MROM cells to normal wordlines. As shown in FIG. 7, MROM cells 214, 216, 218 and 220 each have a polysilicon gate corresponding to one of the normal wordlines, where each of the MROM cells has a shared drain terminal 222 connected to a test bitline BL_test via a bitline contact, and a shared or dedicated source terminal 224 connected to voltage supply VDD or VREF. Although the test bitline BL_test is connected to a test sense amplifier 226, alternatively it can be selectively coupled to one of the normal sense amplifiers in block 106 during testing, as will be shown later in FIG. 10. According to the present embodiment, each MROM cell is similar in construction to the anti-fuse transistor devices, except that they do not have a variable thickness gate oxide. In the example of FIG. 7, the thick gate oxide definition mask 72 is extended to define a thick gate oxide over the channel regions underneath each polysilicon gate. In other words, MROM cells 214, 216, 218 and 220 function similarly to either core logic transistors or I/O transistors formed on the same substrate as OTP memory device 100.

In operation, each of the MROM cells charges the test bitline BL_test to about VDD-Vtn, where Vtn is a threshold voltage of an n-channel transistor, in response to a normal wordline being activated or driven to a positive voltage level such as VDD. Provided there are no physical defects in the bitlines, all the normal bitlines and the test bitline BL_test are driven to the full VDD level if WL_test and each of the normal wordlines WLi to WLi+3 are driven to a voltage level above VDD. If there is a defect in the row decoding logic, or a physical defect such as a break in the normal wordline anywhere between the row test circuit 108 and the row circuits 104 (not shown), then the test bitline will not have the VDD-Vtn voltage level. Accordingly, the failure to sense the VDD-Vtn voltage on BL_test indicates some type of failure related to that row.

Figure 8:
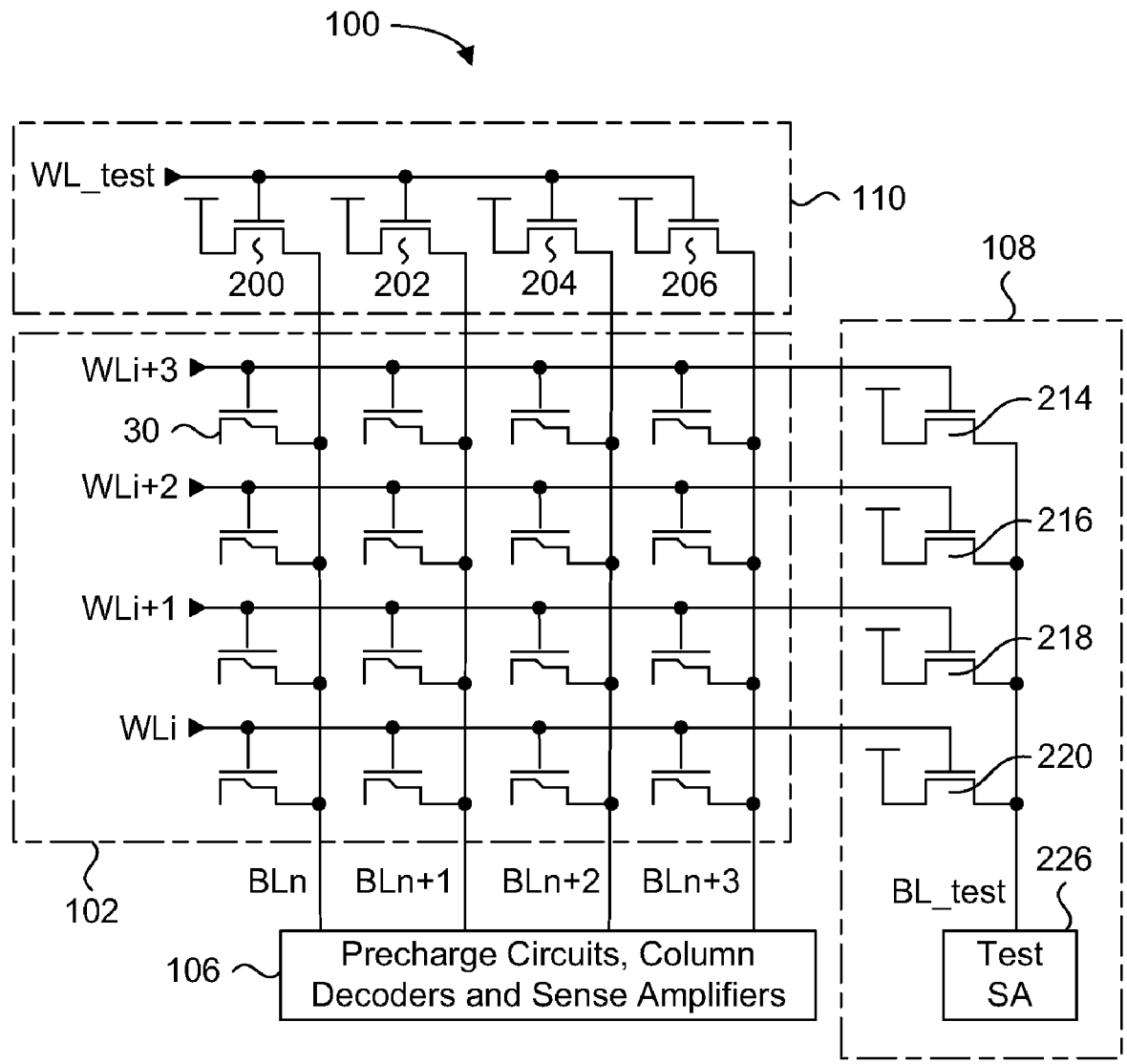
FIG. 8 is a circuit schematic of the single-transistor anti-fuse memory array of FIG. 7.

FIG. 8 shows the equivalent circuit schematic of the OTP memory array 102, row test circuit 108 and column test circuit 110. The anti-fuse cells 30 used in FIG. 8 are represented by a distinct transistor symbol that is different than the well known symbol for n-channel transistors. In particular, the presently used anti-fuse transistor symbol designates that the anti-fuse transistor has a variable thickness gate oxide. The column circuit block 106 is shown as a generic box as in FIG. 7. FIG. 8 clearly shows how the column testing circuit 110 can coupling the normal bitlines to a voltage level that can be sensed by column circuit block 106, and how the row testing circuit 108 can couple the test bitline to a voltage level that can be sensed by test sense amplifier 226. Because these bitline voltages can be sensed, the row circuits 104 and the column circuits 106 can be tested before shipment to the end user who will be programming the OTP memory array 102. As will be described later, a testing algorithm can be developed to automatically cycle through the column and row addresses to check if the expected sensed data from the bitlines is read out properly or not.

Figure 9:
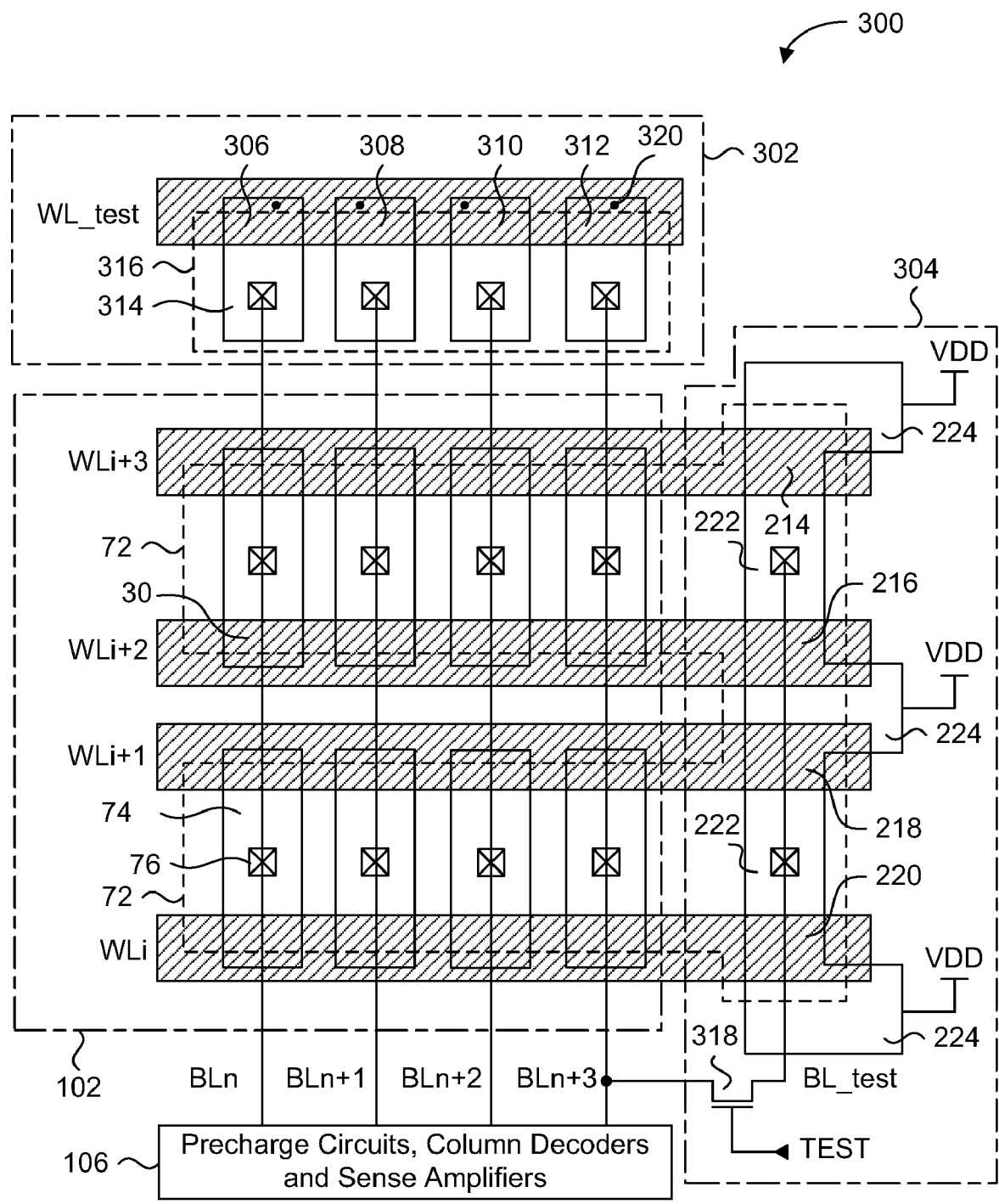
FIG. 9 is a plan view of a single-transistor anti-fuse memory array with row and column test circuits, according to an alternate embodiment of the present invention.

In the embodiments of FIGS. 7 and 8, the row test circuit 108 and column test circuit 110 are considered part of the OTP memory array 102, since the MROM cells are fabricated with substantially the same dimensions and process used for fabricating the anti-fuse memory cells. Accordingly, the circuit area overhead for implementing these test circuits is minimal. FIG. 9 is an alternate embodiment of OTP memory device 100 that further minimizes circuit area overhead of a row test circuit and a column test circuit, according to an embodiment of the present invention.

In FIG. 9, OTP memory device 300 includes the same OTP memory array 102 and column circuit block 106 shown in FIG. 7. In the present embodiment, the column test circuit 302 includes a row of column test cells, such as anti-fuse transistors identical to anti-fuse cells 30 in OTP memory array 102. This row of column test cells will be programmed in a first test cycle. The row test circuit 304 is identical to the row test circuit 108 except that it does not include a test sense amplifier. Alternatively, the row test circuit 304 may include a column of row test cells, such as anti-fuse transistors (not shown) identical to anti-fuse cells 30 in OTP memory array 102. This column of row test cells will be programmed in a first test cycle. Both test circuits have at least the same functionality as the corresponding test circuits shown in FIG. 7. The column test circuit 302 includes anti-fuse transistors 306, 308, 310 and 312, each having a gate formed by the polysilicon test wordline WL_test. Each of the anti-fuse transistors 306, 308, 310 and 312 has a drain diffusion region 314 with a bitline contact connected to a corresponding normal bitline. A thick gate oxide definition mask 316 delineates the thick and thin gate oxide portions of the variable thickness gate oxide of the anti-fuse transistors, such that the part of the active area not covered by the thick gate oxide definition mask 316 underneath the polysilicon wordline WL_test is covered by a thin gate oxide. Accordingly, the structure of the anti-fuse transistors 306, 308, 310 and 312 should be the same as the anti-fuse cells 30 formed in the OTP memory array 102. The anti-fuse transistors 306, 308, 310 and 312 do not consume as much substrate area as MROM cells 200, 202, 204 and 206, thereby reducing the circuit area overhead of column test circuit 302 relative to column test circuit 110. In the row test circuit 304, a test coupling device shown as an n-channel transistor 318 selectively connects the test bitline BL_test to the adjacent normal bitline BLn+3 in response to a test control signal TEST.

Figure 10:
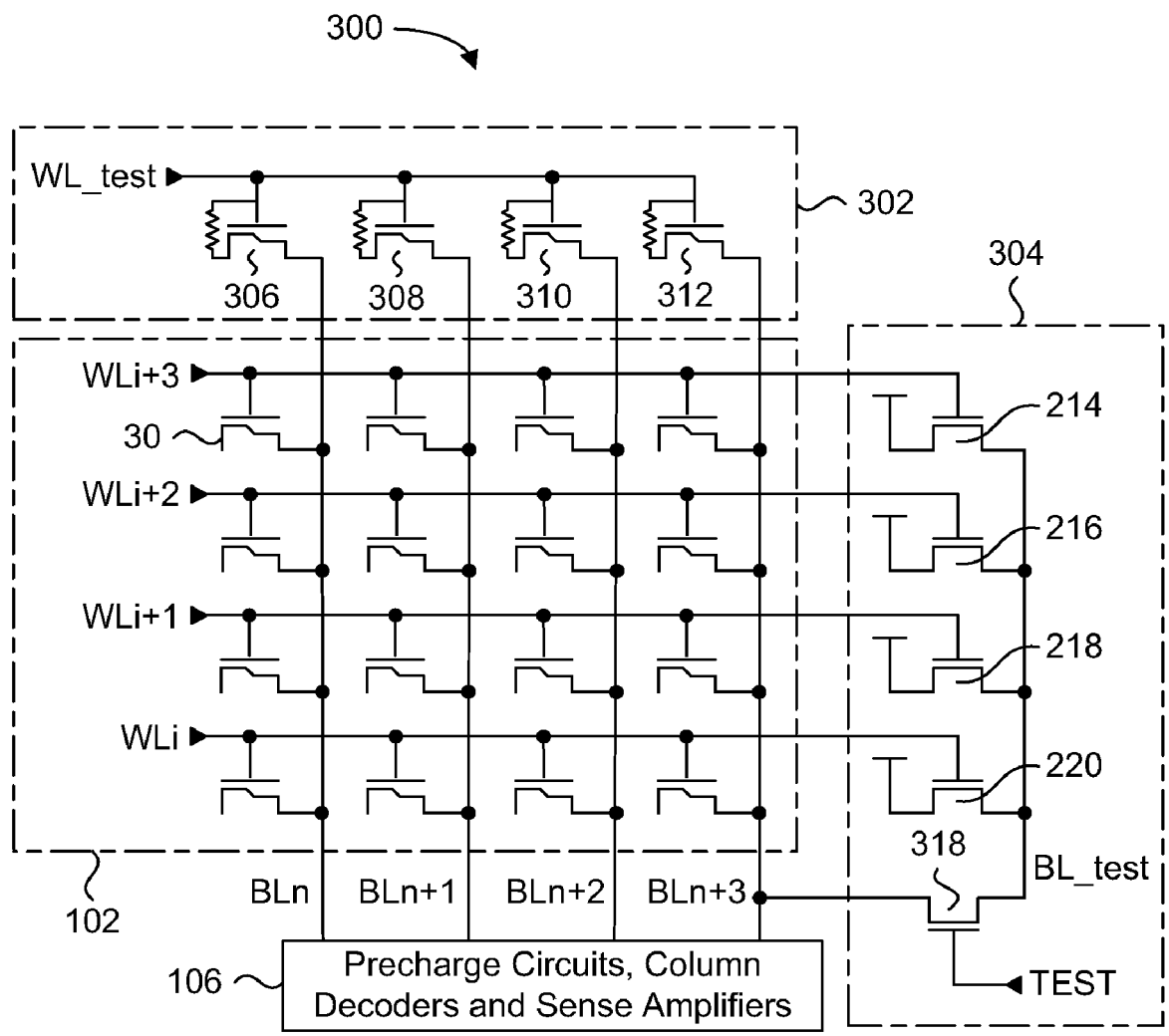
FIG. 10 is a circuit schematic of the single-transistor anti-fuse memory array of FIG. 9.

FIG. 10 shows the equivalent circuit schematic of the OTP memory array 102, row test circuit 304 and column test circuit 302. In order to illustrate the programmed status of anti-fuse transistors 306, 308, 310 and 312, a resistor symbol is connected between the gate terminal and the source terminal of each anti-fuse transistor 306, 308, 310 and 312. The absence of this resistor indicates the unprogrammed status of the anti-fuse transistor. Accordingly, once successfully programmed, the column test circuit 302 can be used to couple the normal bitlines to VDD.

The general operation of column test circuit 302 is now described. Prior to testing the functionality of the column circuits 106, the anti-fuse transistors 306, 308, 310 and 312 are programmed. This is done by biasing the normal bitlines to VSS while driving the test wordline WL_test to VPP. If programming is successful, conductive links 320 will be formed in each of anti-fuse transistors 306, 308, 310 and 312. Hence any program verify logic can be tested as part of the programming operation for the anti-fuse transistors of column test circuit 302. In a fabricated device, there can be redundant test rows and test columns so that if one is defective for any reason, the other can be used instead. Assuming that programming is successful, the column circuits 106 can be tested by driving WL_test to a read voltage level, such as VDD for example. Because each of anti-fuse transistors 306, 308, 310 and 312 has a conductive link formed therein, WL_test couples the normal bitlines to VDD.

The general operation of row test circuit 304 is now described. During the test mode, signal TEST is driven to VDD to turn on test coupling device 318 and connect BL_test to BLn+3. The column decoding logic within column circuit block 106 then routes the voltage of BL_test to an existing sense amplifier, which then provides a logic state corresponding to the voltage of BL_test. Hence an existing sense amplifier is reused, thereby obviating the need to include an extra dedicated sense amplifier for row test circuit 304.

It is noted that different combinations of the row test circuit and the column test circuit embodiments shown in FIGS. 7 and 9 can be used together with an OTP memory array. For example, the MROM cells of the row test circuit 304 can be replaced with anti-fuse cells. Accordingly, prior to executing any testing of the rows, these anti-fuse cells are first subjected to programming. Alternately, just one of the row test circuit and the column test circuit can be used with an OTP memory array. While the data can be read out of the memory device for assessment by external testing apparatus, self test logic can be included on-chip for comparing the sensed data logic levels against expected logic levels.

Figure 11:
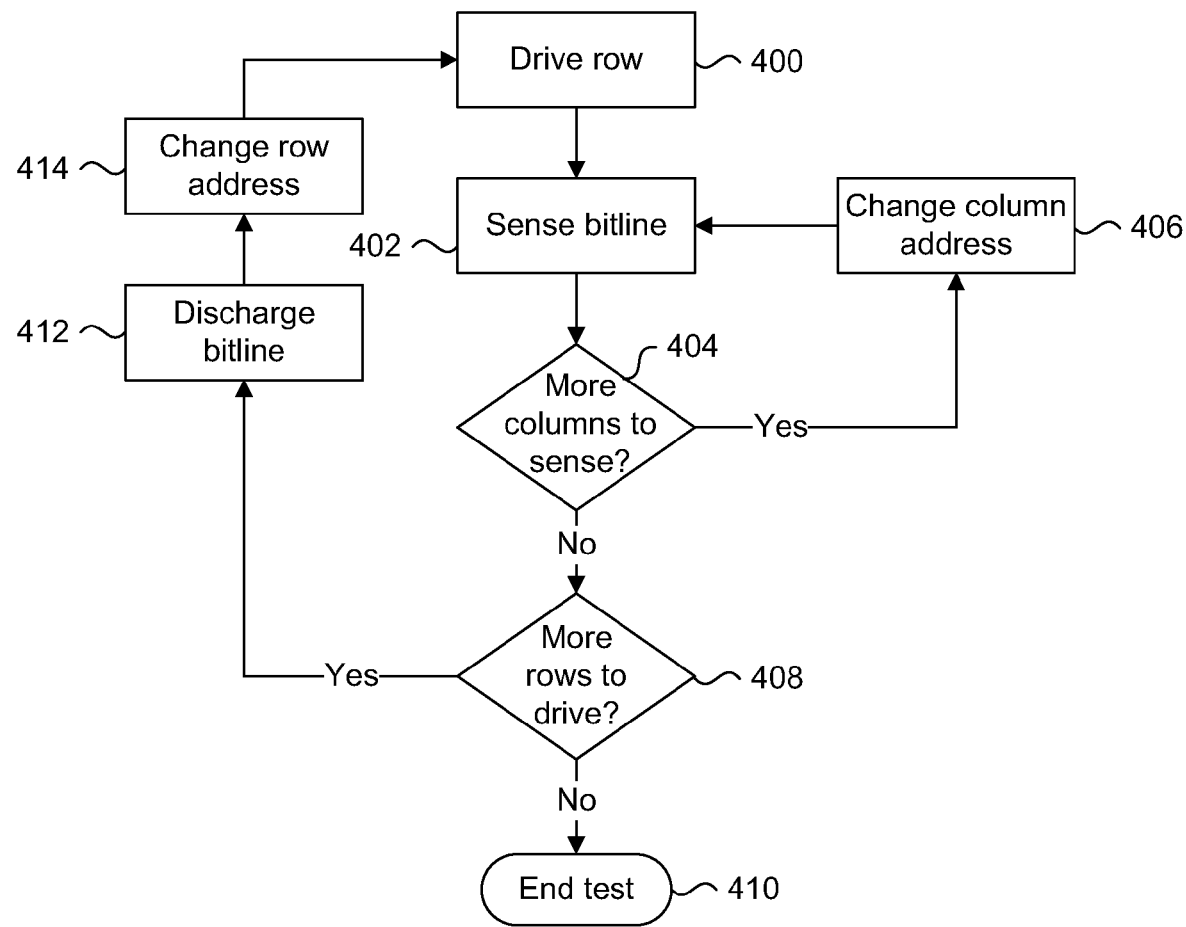
FIG. 11 is a flow chart showing a method for testing an OTP memory array using row and column test circuits; and, FIG. 12 is a plan view of a two-transistor anti-fuse memory array with row and column test circuits, according to an alternate embodiment of the present invention.

FIG. 11 is a flow chart showing a method for testing the OTP memory array using the previously described row and column test circuits, according to an embodiment of the present invention. The method steps can be automated and designed as a built-in-self-test (BIST) algorithm executable by an on-chip controller, or executed automatically via an external computing device. If the column test circuit 302 embodied in FIG. 9 is used, then it is assumed that all the anti-fuse cells of column test circuit 302, such as cells 306, 308, 310 and 312, have been successfully programmed. The test method begins at step 400, where a first row is activated, or driven to a voltage level effective for turning on the transistor devices it is connected to. This first row can include either the test wordline WL_test of the column test circuits 110 or 302 for turning on the MROM cells or the anti-fuse cells therein, or one of the normal wordlines WLi to WLi+3 for turning on the MROM cells of the row test circuits 108 or 304. This results in coupling of the normal bitlines BLn to BLn+3 or of the test bitline BL_test to VDD. Following at step 402, sensing of the normal bitlines or the test bitline occurs and the result of the sensing is provided to the test system or tester for determination of a pass or fail result.

It should be noted that the column decoding circuits typically couple a predetermined number of the bitlines to a limited number of sense amplifier circuits. In such a memory architecture, a decision is made at step 404 to determine if there are further columns to sense. In the situation where there are further columns to sense, the column address is changed at step 406, and other bitlines are sensed at step 402. The iteration of steps 402, 404 and 406 are executed when the column test circuit is used to test column decoding for all the column addresses. For row testing, step 402 is executed once for the test bitline. In such a case, the method proceeds to step 408.

A determination is made at step 408 if there are further wordlines to drive or not. If the current test is for testing the column circuits, then there are no further wordlines to drive. Accordingly, the test ends at step 410. On the other hand, if the current test is for testing the row circuits, then other wordlines remain to be driven. In this situation, the method proceeds to step 412 where the test bitline is discharged, and the row address is changed at step 414. The row address can be changed according to any pattern, such as a sequential pattern for example. Once the new row address has been latched, then the method returns to step 400 where a new wordline corresponding to the new row address is driven. Steps 400, 402, 404, 408, 412 and 414 iterate until there are no further wordlines to be driven. The number of iterations can be reduced by having the system terminate the test if a fail result is received after any iteration. Therefore, the steps outlined in FIG. 11 can be used for column circuit testing or row circuit testing using the column and row test circuit embodiments respectively. If both the column test circuit and the row test circuit are included in the memory device, then testing for both the column circuits and the row circuits can be executed in any order.

Figure 4A:
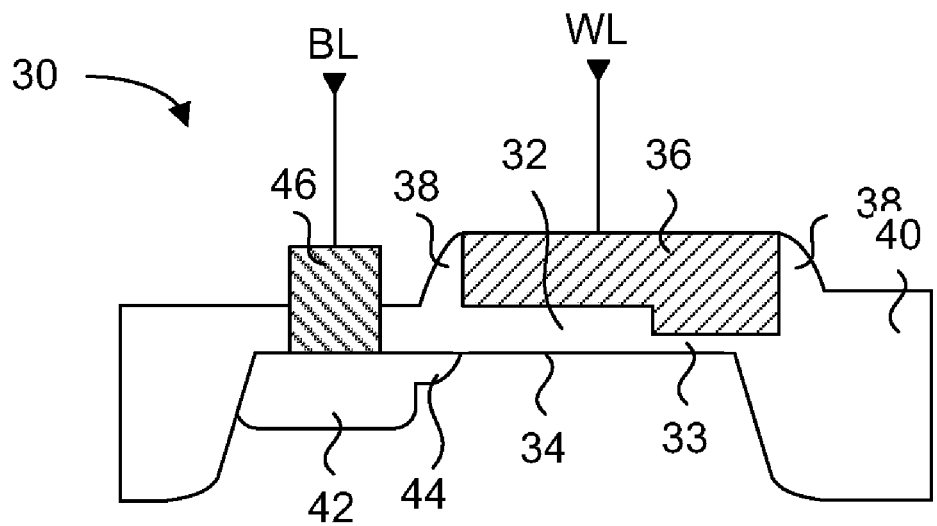
FIG. 4a is a cross-sectional view of a variable thickness gate oxide anti-fuse transistor.
Figure 4B:
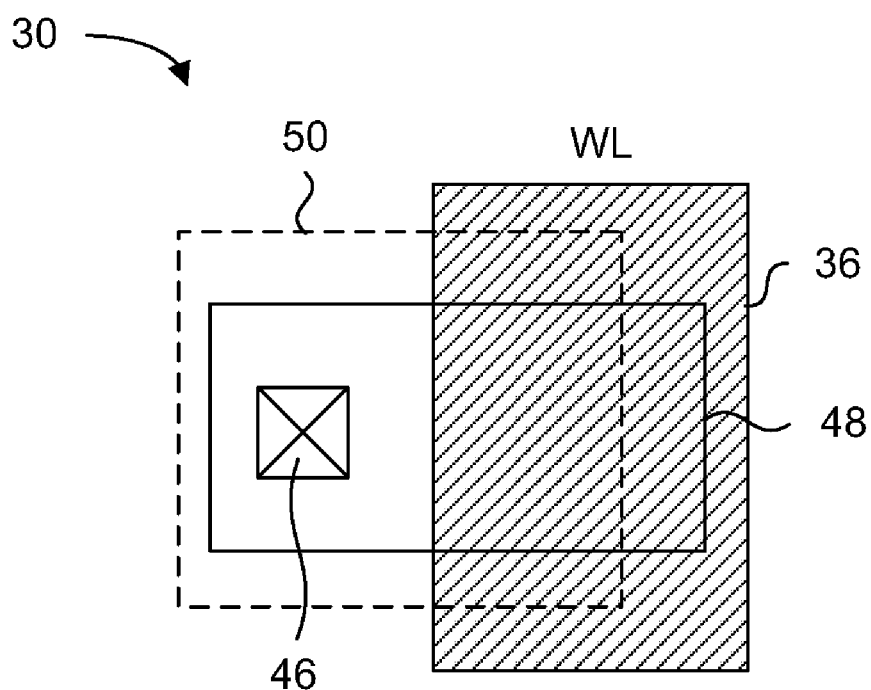
Figure 5:
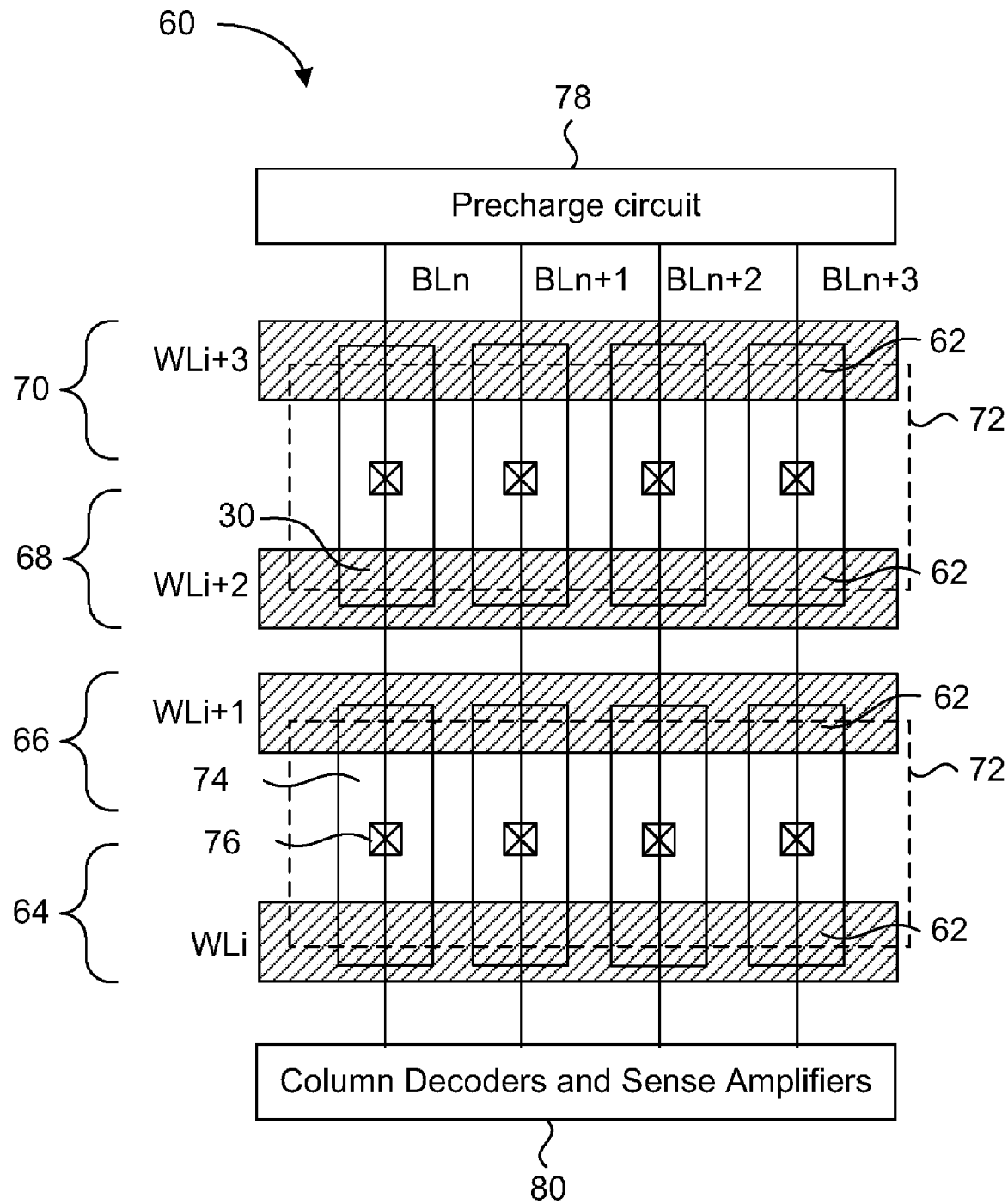

The previously described embodiments of the OTP memory device 100 and the OTP memory device 300 of FIGS. 7 and 9 use single transistor anti-fuse cells shown in FIGS. 4a and 4b. The embodiments of the present invention are not limited to single transistor anti-fuse transistors, and alternate embodiments where the memory array consists of two-transistor anti-fuse cells can be used. For example, the two-transistor anti-fuse cell of FIGS. 2 and 3 can be used in an OTP memory array 102, a column test circuit and a row test circuit, according to the present alternate embodiment.

Figure 12:
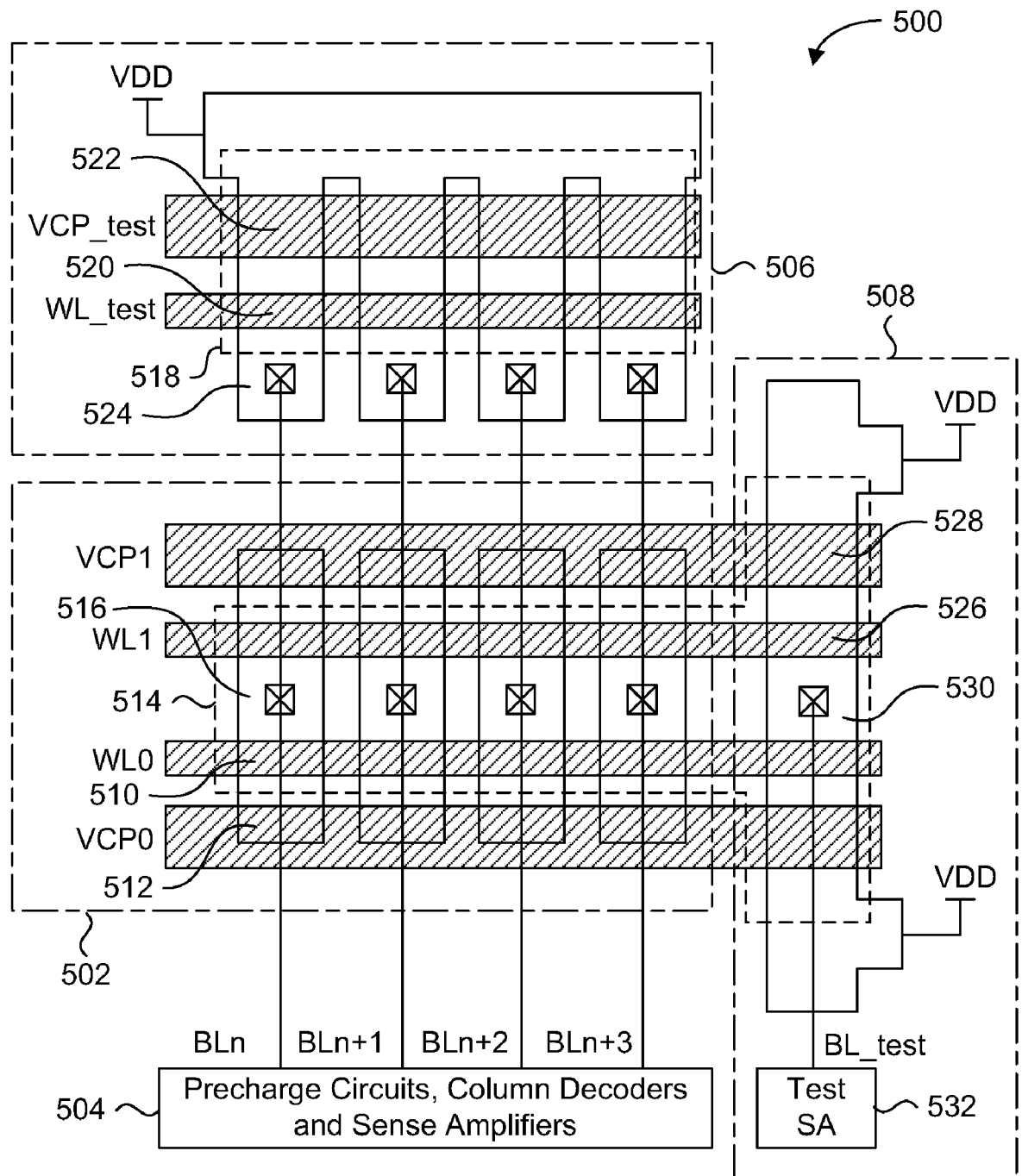

FIG. 12 is a plan view of a two-transistor anti-fuse memory array with row and column test circuits, according to an alternate embodiment of the present invention. OTP memory device 500 includes an OTP memory array 502, column circuits 504, a column test circuit 506 and a row test circuit 508. The row circuits are not shown in FIG. 12, and the column circuits 504 can be the same as column circuits 106 shown and described in the previous embodiments. The OTP memory array 502 is shown to include two rows of two-transistor anti-fuse cells. Each of the two-transistor anti-fuse cells has the structure shown in FIGS. 2 and 3, where an access transistor 510 is formed in series with an anti-fuse device 512. The first row includes wordline WL0 and VCP0, while the second row includes wordline WL1 and VCP1. A thick gate oxide definition mask 514 defines the areas within which thick oxide is to be formed. As shown in FIG. 12, the two-transistor cells in the first row and the second row of the same column share a common diffusion region 516 having a bitline contact connected to a corresponding bitline.

In the alternate embodiment of FIG. 12, the column test circuit 506 includes two-transistor anti-fuse cells which are identical in layout dimensions to those in the OTP memory array 502. The gate terminal of the access transistor 520 is formed by a polysilicon line WL_test, and the gate terminal of the anti-fuse device 522 is formed by a polysilicon line VCP_test. A diffusion region 524 of the access transistor 520 is coupled to a corresponding normal bitline. These anti-fuse cells differ from those in the OTP memory array 502. First, the thick oxide definition mask 518 covers both the access transistor 520 and the anti-fuse device 522, meaning that the anti-fuse device is formed with a thick gate oxide. Second, the anti-fuse device 522 has an additional diffusion region that is coupled to the VDD supply. Therefore, when both VCP_test and WL_test are driven to at least VDD, both the access transistor 520 and the anti-fuse device 522 turn on to couple the normal bitline to VDD, thereby coupling the normal bitline to VDD. Accordingly, the two-transistor anti-fuse cells of the column test circuit 506 are fabricated as MROM cells. Alternately, the thick oxide definition mask 518 can be sized to exclude the anti-fuse device 522, and the additional diffusion region coupled to VDD can be omitted, thereby configuring these anti-fuse cells to be identical to those in the OTP memory array 502. In such an alternate configuration, the anti-fuse cells are programmed before any testing operations are to be executed.

The row test circuit 508 includes two-transistor anti-fuse cells which are identical in layout dimensions to those in the OTP memory array 502. The gate terminal of the access transistor 526 is formed by the polysilicon wordline of the corresponding row (ie. WL1), and the gate terminal of the anti-fuse device 528 is formed by the polysilicon line of the same corresponding row (ie. VCP1). A diffusion region 530 of the access transistor 526 is coupled to a test bitline BL_test via a bitline contact. The test bitline BL_test is connected to a dedicated test sense amplifier 532, but as shown in the previous embodiments, BL_test can be routed to a normal bitline for sensing by an existing sense amplifier. The two-transistor anti-fuse cells of row test circuit 508 are the same as those in column test circuit 506, in that the anti-fuse device 528 has an additional diffusion region coupled to VDD, and has a thick gate oxide as defined by the area covered by the thick gate oxide definition mask 514. Therefore, BL_test is coupled to VDD when a wordline and its corresponding VCP are driven to at least VDD. As for anti-fuse devices in the row test circuit 508, they can be configured as true anti-fuse cells which are programmed before any testing operations are executed.

According to a further alternate embodiment, either the anti-fuse device or access transistor can be omitted from one or both of the column test circuit 506 and the row test circuit 508 to further minimize circuit area overhead.

The previously described embodiments permit testing of an unprogrammed OTP memory array, and in particular the physical conductor lines that extend across the memory array and corresponding logic circuitry associated with these conductor lines. As shown in the previous embodiments, the physical conductor lines are the bitlines and the corresponding logic circuitry is the column decoding logic. Alternately, the physical conductor lines are the wordlines and the corresponding logic circuitry is the row decoding logic. Of course, other circuits related to the physical conductor lines can be tested for proper functionality using the previously described embodiments simply by executing read and/or program operations.

In the preceding description, for purposes of explanation, numerous details are set forth in order to provide a thorough understanding of the embodiments of the invention. However, it will be apparent to one skilled in the art that these specific details are not required in order to practice the invention. In other instances, well-known electrical structures and circuits are shown in block diagram form in order not to obscure the invention. For example, specific details are not provided as to whether the embodiments of the invention described herein are implemented as a software routine, hardware circuit, firmware, or a combination thereof.

Embodiments of the invention can be represented as a software product stored in a machine-readable medium (also referred to as a computer-readable medium, a processor-readable medium, or a computer usable medium having a computer-readable program code embodied therein). The machine-readable medium can be any suitable tangible medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the invention. Those of ordinary skill in the art will appreciate that other instructions and operations necessary to implement the described invention can also be stored on the machine-readable medium. Software running from the machine-readable medium can interface with circuitry to perform the described tasks.

The above-described embodiments of the invention are intended to be examples only. Alterations, modifications and variations can be effected to the particular embodiments by those of skill in the art without departing from the scope of the invention, which is defined solely by the claims appended hereto.

What is claimed is:

1. A one time programmable (OTP) memory comprising:
   a memory array having unprogrammed OTP cells;
   decoding circuits located at a first end of the memory array;
   a test circuit including test cells located at a second and opposite end of the memory array, the test cells being mask programmed for coupling at least one bitline to a first voltage in response to an activated wordline during a testing operation, the at least one bitline being precharged to a second voltage during a normal read operation; and
   sense circuitry for sensing the voltage of the at least one bitline.

2. The OTP memory of claim 1, wherein the first voltage of the at least one bitline corresponds to a read voltage provided by a programmed OTP cell.

3. The OTP memory of claim 1, wherein the test circuit couples a plurality of bitlines connected to the unprogrammed OTP cells to the first voltage, and the decoding circuits include column circuits connected to the plurality of bitlines.

4. The OTP memory of claim 3, wherein the test circuit includes a row of mask programmed cells having their gate terminals formed by the activated wordline, each of the mask programmed cells being connected to one of the plurality of bitlines.

5. The OTP memory of claim 4, wherein each of the unprogrammed OTP cells and each of the test cells are single transistor cells having identical layouts.

6. The OTP memory of claim 4, wherein each of the unprogrammed OTP cells and each of the test cells are two-transistor cells having identical layouts.

7. The OTP memory of claim 1, wherein the decoding circuits include row circuits connected to a plurality of wordlines, the activated wordline being one of the plurality of wordlines, and the plurality of wordlines being connected to rows of the unprogrammed OTP cells.

8. The OTP memory of claim 7, wherein the test circuit includes a column of mask programmed cells having their gate terminals formed by the plurality of wordlines, each of the mask programmed cells being connected to the at least one bitline.

9. The OTP memory of claim 8, wherein the sense circuitry is a dedicated test sense amplifier for sensing the first voltage of the at least one bitline.

10. The OTP memory of claim 9, wherein the test circuit includes a test coupling device for selectively connecting the at least one bitline to a bitline connected to a column of unprogrammed OTP cells.

11. A one time programmable (OTP) memory comprising:
    a memory array having unprogrammed OTP cells connected to wordlines and bitlines;
    a row test circuit including mask programmed cells connected to the wordlines for charging a test bitline to a first voltage in response to activation of one of the wordlines;
    a column test circuit including mask programmed cells for coupling the bitlines to the first voltage in response to activation of a test wordline during a testing operation, the bitlines being precharged to a second voltage during a normal read operation; and
    sense circuitry for sensing the voltage of the bitlines and the test bitline.

12. The OTP memory of claim 11, wherein the row test circuit is connected to a first end of the wordlines, and row circuits for driving the wordlines are connected to a second end of the wordlines opposite to the first end.

13. The OTP memory of claim 12, wherein the column test circuit is connected to a first end of the bitlines, and column circuits are connected to a second end of the bitlines opposite to the first end.

14. The OTP memory of claim 13, wherein the row test circuit includes a column of mask programmed cells having their gate terminals formed by the wordlines, each of the mask programmed cells being connected to the test bitline.

15. The OTP memory of claim 14, wherein the column test circuit includes a row of mask programmed cells connected to the bitlines and having their gates formed by the test wordline.

16. A method for testing an unprogrammed one time programmable (OTP) memory array comprising:
    activating a test circuit including mask programmed memory cells for coupling at least one bitline to a first voltage level, the at least one bitline being precharged to a second voltage level during a normal read operation; and, sensing the at least one bitline to provide a logic state corresponding to one of a presence and absence of the voltage level.

17. The method of claim 16, wherein activating includes driving a wordline coupled to a row of mask programmed memory cells, the mask programmed memory cells coupling a plurality of bitlines to the first voltage level.

18. The method of claim 17, further including iteratively changing a column address and sensing a different bitline of the plurality of bitlines.

19. The method of claim 16, wherein the at least one bitline includes a test bitline connected to a column of mask programmed memory cells, and activating includes driving a wordline coupled to one of the mask programmed memory cells for coupling the test bitline to the first voltage level.

20. The method of claim 19, further including precharging the test bitline to the second voltage level after the step of sensing, and changing a row address for driving another wordline coupled to another one of the mask programmed memory cells.

* * * * *